(12) United States Patent
Wu et al.

(10) Patent No.: US 9,250,514 B2
(45) Date of Patent: Feb. 2, 2016

(54) APPARATUS AND METHODS FOR FABRICATING A PHOTOMASK SUBSTRATE FOR EUV APPLICATIONS

(71) Applicant: Applied Materials, Inc., Santa Clara, CA (US)

(72) Inventors: Banqiu Wu, Sunnyvale, CA (US); Ajay Kumar, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 140 days.

(21) Appl. No.: 14/199,575

(22) Filed: Mar. 6, 2014

(65) Prior Publication Data

US 2014/0255830 A1     Sep. 11, 2014

Related U.S. Application Data

(60) Provisional application No. 61/776,310, filed on Mar. 11, 2013.

(51) Int. Cl.
*C03C 15/00* (2006.01)
*G03F 1/80* (2012.01)
*G03F 1/22* (2012.01)

(52) U.S. Cl.
CPC ... *G03F 1/80* (2013.01); *G03F 1/22* (2013.01)

(58) Field of Classification Search
CPC ..................................................... G03F 1/22
USPC .......... 216/58, 37, 67; 430/5, 395; 355/67, 77
See application file for complete search history.

(56) References Cited

U.S. PATENT DOCUMENTS

| | | |
|---|---|---|
| 5,592,358 A | 1/1997 | Shamouilian et al. |
| 5,996,218 A | 12/1999 | Shamouilian et al. |
| 6,022,460 A | 2/2000 | O et al. |
| 6,023,038 A | 2/2000 | van Gogh |
| 6,391,791 B1 | 5/2002 | Sasaki et al. |
| 6,416,909 B1 | 7/2002 | Quek et al. |
| 6,444,137 B1 | 9/2002 | Collins et al. |
| 6,469,283 B1 | 10/2002 | Burkhart et al. |
| 6,488,820 B1 | 12/2002 | Burkhart |
| 6,740,842 B2 | 5/2004 | Johnson et al. |
| 6,806,651 B1 | 10/2004 | Chistyakov |
| 7,033,947 B2 | 4/2006 | Tzu et al. |
| 7,128,806 B2 | 10/2006 | Nguyen et al. |
| 7,205,741 B2 | 4/2007 | Simons et al. |
| 8,287,688 B2 | 10/2012 | Wallace et al. |
| 2006/0166506 A1 | 7/2006 | Okawa et al. |
| 2006/0292727 A1 | 12/2006 | Motokawa et al. |
| 2008/0012511 A1 | 1/2008 | Ono |
| 2011/0157760 A1 | 6/2011 | Willwerth et al. |
| 2012/0289054 A1 | 11/2012 | Holland et al. |

*Primary Examiner* — Duy Deo
*Assistant Examiner* — Maki Angadi
(74) *Attorney, Agent, or Firm* — Patterson & Sheridan, LLP

(57) ABSTRACT

An apparatus and methods utilized a DC or AC power to supply through a conductive substrate support pedestal to a conductive photomask substrate during a photomask substrate manufacturing process for EUV or other advanced lithography applications are provided. In one embodiment, an apparatus for processing a photomask includes a substrate support pedestal configured to receive a conductive photomask, wherein the conductive photomask is fabricated from a dielectric material substrate with a conductive coating, and at least a conductive path formed in the substrate support pedestal in contact with the photomask substrate configured to be conductive.

20 Claims, 4 Drawing Sheets

APPARATUS AND METHODS FOR FABRICATING A PHOTOMASK SUBSTRATE FOR EUV APPLICATIONS

CROSS-REFERENCE TO RELATED APPLICATIONS

This application claims benefit of U.S. Provisional Application Ser. No. 61/776,310 filed Mar. 11, 2013, which is incorporated by reference in its entirety.

BACKGROUND

1. Field

Embodiments of the present invention generally relate to an apparatus and methods for fabricating a photomask substrate for EUV applications and, more specifically, to an apparatus and methods for fabricating a photomask substrate with conductive contact from the apparatus to the photomask substrate during photomask fabrication process for EUV applications.

2. Description of the Related Art

In the manufacture of integrated circuits (IC), or chips, patterns representing different layers of the chip are created by a chip designer. A series of reusable masks, or photomasks, are created from these patterns in order to transfer the design of each chip layer onto a semiconductor substrate during the manufacturing process. Mask pattern generation systems use precision lasers or electron beams to image the design of each layer of the chip onto a respective mask. The masks are then used much like photographic negatives to transfer the circuit patterns for each layer onto a semiconductor substrate. These layers are built up using a sequence of processes and translate into the tiny transistors and electrical circuits that comprise each completed chip. Thus, any defects in the mask may be transferred to the chip, potentially adversely affecting chip performance. Defects that are severe enough may render the mask completely useless. Typically, a set of 15 to 30 masks is used to construct a chip and can be used repeatedly.

A photomask is typically a dielectric material, glass or a quartz substrate with a film stack having multiple layers. These layers may include a light-absorbing layer and an opaque layer disposed thereon. When manufacturing the photomask layer, a photoresist is typically disposed on the film stack to facilitate transferring features into the film stack during the subsequently patterning processes. During the patterning process, the circuit design is written onto the photomask by exposing portions of the photoresist to electron beam or ultraviolet light, making the exposed portions soluble in a developing solution. The soluble portion of the resist is then removed, allowing the exposed underlying film stack be etched. The etch process removes the film stack from the photomask at locations where the resist was removed, i.e., the exposed film stack is removed.

With the shrink of critical dimensions (CD), present optical lithography is approaching a technological limit at the 45 nanometer (nm) technology node. Next generation lithography (NGL) is expected to replace the conventional optical lithography, for example, in the 32 nm technology node and beyond. There are several NGL candidates, such as extreme ultraviolet (EUV) lithography (EUVL), electron projection lithography (EPL), ion projection lithography (IPL), nanoimprint, and X-ray lithography. Among these, EUVL is the most likely successor due to the fact that EUVL has most of the properties of optical lithography, which is more mature technology as compared with other NGL methods.

During an etching process for etching the film stack disposed on the photomask, an alternating current (AC) power is often supplied to a cathode (e.g., a substrate support) to generate a bias power to the photomask. However, alternating current power (AC) often includes multiple waveform phases. Different phase angles generated by the alternating current may result in ion bombardment of the photomask to be unpredictable across different regions of the photomask, thereby resulting non-uniform etching across the substrate surface. Furthermore, as the feature size on the photomask continues to get smaller, different phase angles of the alternating current may cause ions to travel in different directions or to different locations in the processing chamber, thus failing to penetrate into small features required to form the photomask, thereby resulting in defects or the formation of undesired profiles formed in the photomask.

Therefore, there is a need for supplying a steady current power during an etching process for forming a photomask for EUV technology.

SUMMARY

Embodiments of the present invention generally provide an apparatus and methods for etching photomasks for EUV technologies. Embodiments of the present invention also generally relate to photomask manufacture technology for binary, PSM, OMOG and EUV Lithography. In one embodiment, an apparatus for processing a photomask includes a substrate support pedestal configured to receive a conductive photomask, wherein the conductive photomask is fabricated from a dielectric material substrate with a conductive coating, and at least a conductive path formed in the substrate support pedestal in contact with the photomask substrate configured to be conductive.

In another embodiment, a method for etching a photomask for EUV applications includes providing a conductive photomask on a substrate support pedestal disposed in a plasma processing chamber, wherein the conductive photomask is fabricated from a dielectric material substrate with a conductive coating, supplying a gas mixture into the processing chamber, and applying a DC power through a conductive path formed in the substrate support pedestal to the conductive photomask during etching, wherein the substrate conductive path in the substrate support pedestal allows DC power to pass therethrough to the conductive photomask.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention provides a method and apparatus for manufacturing a photomask. More specifically, the invention relates to a processing chamber providing a conductive contact between a photomask and a substrate support pedestal disposed in the processing chamber for manufacturing a photomask with improved etching uniformity and profile control.

Figure 1A:
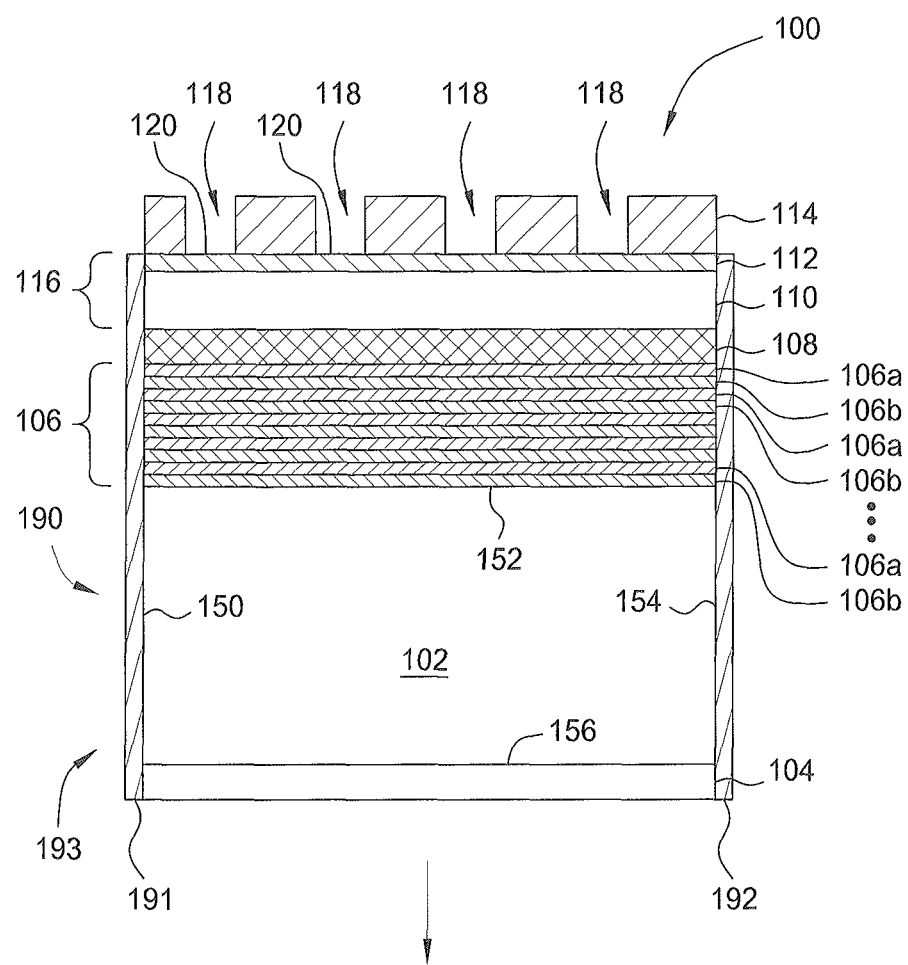
FIG. 1A-1B depict one embodiment of a film stack for manufacturing an EUV photomask in accordance with one embodiment of the invention.
Figure 1B:
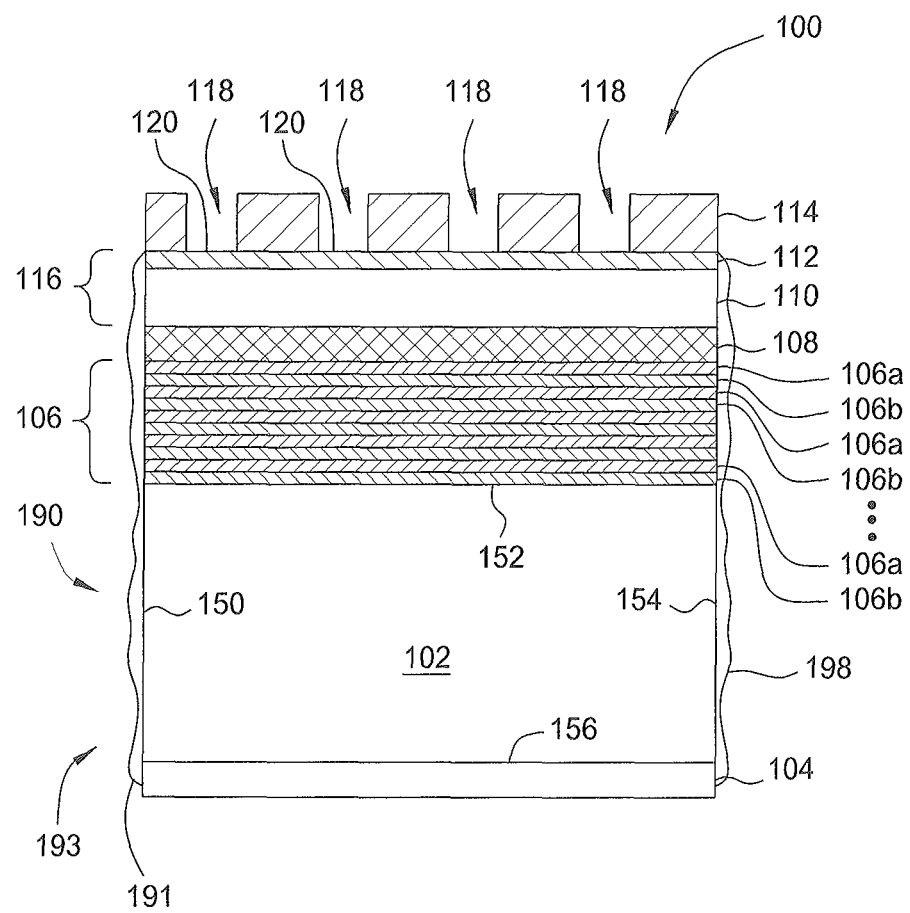

FIGS. 1A-1B depicts a conductive photomask 190 having a film stack 100 disposed on the conductive photomask 190 that may be utilized to form desired features (i.e., openings 118) on the conductive photomask 190. The photomask 190 may be configured to be conductive so as to provide a conductive contact to a substrate support pedestal where the photomask 190 is rest on during an etching process. The conductive photomask 190 may allow utilizing a direct current (DC) power to supply from the substrate support pedestal to the conductive photomask 190 to provide a bias power to the photomask 190 with improved current and power stability.

As the exemplary embodiment depicted in FIG. 1A, the photomask 190 includes a photomask substrate 102. The photomask substrate 102 may be a dielectric substrate or a quartz (i.e., low thermal expansion silicon dioxide ($SiO_2$)) layer. The photomask substrate 102 has a front surface 152, a backside surface 156, a first side 150 and a second side 154 connecting the front surface 152 to the backside surface 156. The front surface 152 of the photomask 102 may have the film stack 100 disposed thereon. The photomask substrate 102 has a rectangular shape having sides between about 5 inches to about 9 inches in length. The photomask substrate 102 may be between about 0.15 inches and about 0.25 inches thick. In one embodiment, the photomask substrate 102 is about 0.25 inches thick. A backside conductive layer 104, such as a chromium containing layer, for example, a chromium nitride (CrN) layer, may be disposed to the backside surface 156 of the photomask substrate 102 as needed.

A EUV reflective multi-material layer 106 is disposed on the photomask substrate 102. The reflective multi-material layer 106 may include at least one molybdenum layer 106a and a silicon layer 106b. Although the embodiment depicted in FIG. 1A shows five pairs of molybdenum layer 106a and a silicon layer 106b (alternating molybdenum layers 106a and the silicon layers 106b repeatedly formed on the photomask substrate 102), it is noted that number of molybdenum layers 106a and the silicon layers 106b may be varied based on different process needs. In one particular embodiment, forty pairs of molybdenum layers 106a and the silicon layers 106b may be deposited to form the reflective multi-material layer 106. In one embodiment, the thickness of each single molybdenum layer 106a may be controlled at between about 1 nm and about 5 nm, such as about 2 nm, and the thickness of the each single silicon layer 106b may be controlled at between about 4 nm and about 7 nm, such as about 5 nm. The reflective multi-material layer 106 may have a total thickness between about 250 nm and about 400 nm. The reflective multi-material layer 106 may have an EUV light reflectivity of up to 70% at 13.5 nm wavelength. The reflective multi-material layer 106 may have a total thickness between about 250 nm and about 1400 nm.

Subsequently, a capping layer 108 is disposed on the reflective multi-material layer 106. The capping layer 108 may be fabricated by a metallic material, such as ruthenium (Ru) material, zirconium (Zr) material, or any other suitable material. In the embodiment depicted in FIG. 1A-1B, the capping layer 108 is a ruthenium (Ru) layer. The capping layer 108 has a thickness between about 1 nm and about 5 nm.

An absorber layer 116 may then be disposed on the capping layer 108. The absorb layer 116 is an opaque and light-shielding layer configured to absorb portion of the light generated during the lithography process. The absorber layer 116 is often manufactured from a conductive material providing desired conductivity in the absorber layer 116 as needed. The absorber layer 116 may be in form of a single layer or a multi-layer structure, such as including an anti-reflective coating (ARC) 112 disposed on a bulk absorber layer 110, as the embodiments depicted in FIGS. 1A-1B. In one embodiment, the absorber layer 116 has a total film thickness between about 50 nm and about 200 nm. The total thickness of the absorber layer 116 advantageously facilitates meeting the strict overall etch profile tolerance for EUV masks in sub-45 nm technology node applications.

In one embodiment, the bulk absorber layer 110 may comprise a conductive material, such as tantalum-based materials with essentially no oxygen, for example tantalum silicide based materials, such as TaSi, nitrogenized tantalum boride-based materials, such as TaBN, and tantalum nitride-based materials, such as TaN. The anti-reflective coating (ARC) 112 may also be fabricated from a conductive material, such as a tantalum and oxygen-based materials. The composition of the anti-reflective coating (ARC) 112 corresponds to the composition of the bulk absorber layer 110 and may comprise oxidized and nitrogenized tantalum and silicon based materials, such as TaSiON, when the bulk absorber layer 110 comprises TaSi or TaSiN; tantalum boron oxide based materials, such as TaBO, when the bulk absorber layer 110 comprises TaBN; and oxidized and nitrogenized tantalum-based materials, such as TaON, when the bulk absorber layer 110 comprises TaN.

A patterned photoresist layer 114 is then formed over the absorber layer 116 having openings 118 formed therein that expose portions 120 of the absorber layer 116 for etching. The photoresist layer 114 may comprise any suitable photosensitive resist materials, such as an e-beam resist (for example, a chemically amplified resist (CAR)), and deposited and patterned in any suitable manner. The photoresist layer may be deposited to a thickness between about 50 nm and about 300 nm.

Additionally, a conductive element 193 may be disposed on either side 150, 154 of the photomask substrate 102 to form a conductive connection from the backside conductive layer 104 to the top absorber layer 116. In one embodiment, the conductive element 193 may be a first side conductive layer 191 disposed on the first side 150 of the photomask substrate 102 connecting the backside conductive layer 104 to the absorber layer 116. As the backside conductive layer 104 and the absorber layer 116 are both fabricated from conductive materials, the first side conductive layer 191 connected therebetween creates an electrical connection from the backside conductive layer 104 to the absorber layer 116, thus, forming a photomask 190 with electrically connected conductive faces, e.g., the electrically conductive top absorber layer 116 is connected to the electrically conductive back conductive layer 158 of the photomask substrate 102. The electrically conductive photomask 190 may provide a direct electrically conductive contact with a substrate support pedestal when the photomask 190 is processed thereon. The electrical connection created by the first side conductive layer 191 may facilitate electrical connection in the perimeter of the photomask 190, e.g., from the bottom 156 through the first side 150 to the top absorber layer 116, so that there is a direct conductive contact between the substrate and to the substrate support pedestal during processing. The electrical connection by the conductive contact between the substrate support pedestal and the conductive photomask 190 allows the use of current (DC) power as a power source for biasing during an etching process, instead of using conventional alternating current (AC) power, which causes process variation due to unstable phase angle variation during processing. In one embodiment, the first side conductive layer 191 is fabricated from a metal containing material, such as chromium containing material, titanium containing material and tantalum containing material. In one example, the first side conductive layer 191 is fabricated from chromium containing material.

In addition, a second side conductive layer 192 may also be disposed on a second side 154 of the photomask layer 102. Similarly, the second side conductive layer 192 may also provide an electrical connect to the perimeter of the photomask 190, e.g., from the bottom 156 through the second side 154 to the top absorber layer 116, so as to provide a direct conductive contact to the substrate support pedestal during processing when the substrate support pedestal is configured conductive. In one embodiment, both the first and the second side conductive layer 191, 192 may be disposed on the first and the second side 150, 154 of the photomask 190 respectively. In another embodiment, either one of the first or the second side of the conductive layer 191, 192 may be disposed on either first side 150 or second side 154 of the photomask 190.

In one embodiment, the first or the second side conductive layer 191, 192 may have a length between about 5 mm and about 9 mm, covering the overall thickness of the backside conductive layer 104, the bulk photomask substrate 102, the reflective multi-material layer 106, the capping layer 108 and the absorber layer 116. In the embodiment wherein the film stack 100 disposed on the photomask substrate 102 may have different film scheme, for examples, different numbers of repeating layers of molybdenum layer 106*a* and the silicon layer 106*b*, the length of the first or the second side conductive layer 191, 192 may be varied as needed to cover the sides 150, 154 of the photomask 190 until both the backside conductive layer 104 and the absorber layer 116 are electrically connected.

Next, the photomask 190 is then transferred to an etching processing chamber, such as the etch reactor 200 which will be further described below with referenced to FIG. 2, to perform an etching process. The etching process is performed to etch the absorb layer 116 exposed through the opening 118 defined by the photoresist layer 114. The etching process is performed to etch the absorb layer 116 until the underlying capping layer 108 is exposed. The ARC 112 and the bulk absorber layer 110 may be continuously etched using one process step, such as with a single etchant chemistry, or separately etched by multiple steps in one or different etching processes as needed. The patterns from the photoresist layer 114 are then transferred into the absorber layer 116 through the etching process.

Subsequently, a reflective multi-material layer etching process may be performed to etch a frame of pattern on the reflective multi-material layer 106. The reflective multi-material etching process uses an etching gas mixture configured to etch the reflective multi-material layer 106 until a desired depth of the reflective multi-material layer 106 is removed, or the underlying photomask substrate 102 is exposed. As the reflective multi-material layer 106 may include more than one types of the materials, the etching gas mixture as selected is configured to have high etching capability to etch different materials as well as maintaining high selectivity to the upper capping layer 108 and the absorber layer 116 so as to maintain desired sidewall profiles.

FIG. 1B depicts another embodiment of the conductive photomask 190 having different configurations of connecting elements 193 formed on the first and the second sides 150, 154 of the photomask substrate 102. In the embodiment depicted in FIG. 1B, a first conductive wire 194 is disposed on the first side 150 of the photomask substrate 102. The conductive wire 194 may electrically connect the backside conductive layer 104 to the top absorber layer 116, thereby establishing an electrical connect from the bottom 156 to the top film stack 100, forming a conductive photomask 190 at its perimeter. In one embodiment, the first conductive wire 194 may be a conductive material fabricated from a chromium containing material, a titanium containing material or a tantalum containing material. In one example, the first conductive wire 194 is fabricated from chromium containing material.

In one embodiment, the first conductive wire 194 may be disposed on the first side 150 of the photomask substrate 102 having a length sufficiently long to connect the backside conductive layer 104 to the top absorber layer 116. In one embodiment, the first conductive wire 194 may have a length between about 5 mm and about 8 mm, covering the overall thickness of the backside conductive layer 104, the bulk photomask substrate 102, the reflective multi-material layer 106, the capping layer 108 and the absorber layer 116.

A second conductive wire 198 may be connected to the second side 154 of the photomask substrate 102 as needed. Similarly, the second conductive wire 198 may electrically connect the backside conductive layer 104 to the top absorber layer 116, thereby establishing an electrical connect from the bottom 156 to the top film stack 110. In one embodiment, the second conductive wire 198 may have a length between about 5 mm and about 8 mm, covering the overall thickness of the backside conductive layer 104, the bulk photomask substrate 102, the reflective multi-material layer 106, the capping layer 108 and the absorber layer 116 as needed.

It is noted that the conductive element 193 formed on the sides 150, 154 of the photomask 190 may be in any configurations, such as conductive layers, conductive wires, as discussed above, conductive bars, or conductive ribbon as needed.

In one embodiment, the photomask 190 may be formed as a conductive substrate, from the backside conductive layer 104 to the top absorber layer 116, by any suitable electrical connecting mechanism to form electrical connection through or around the perimeter of the photomask 190. By doing so, a conductive photomask 190 may be formed from electrical connection formed through the perimeter of the photomask substrate 102. Even though the bulk body of the photomask substrate 102, e.g., a quartz material, a dielectric material or a glass substrate, remains insulated, the conductive current from the substrate support pedestal, from where the photomask 190 is rest on during processing, may successfully pass therethrough to the overall body of the photomask 190 to provide bias power to the photomask 190, thereby enabling use of directional current (DC) power instead of conventional alternating current (AC) power during processing.

Figure 2:
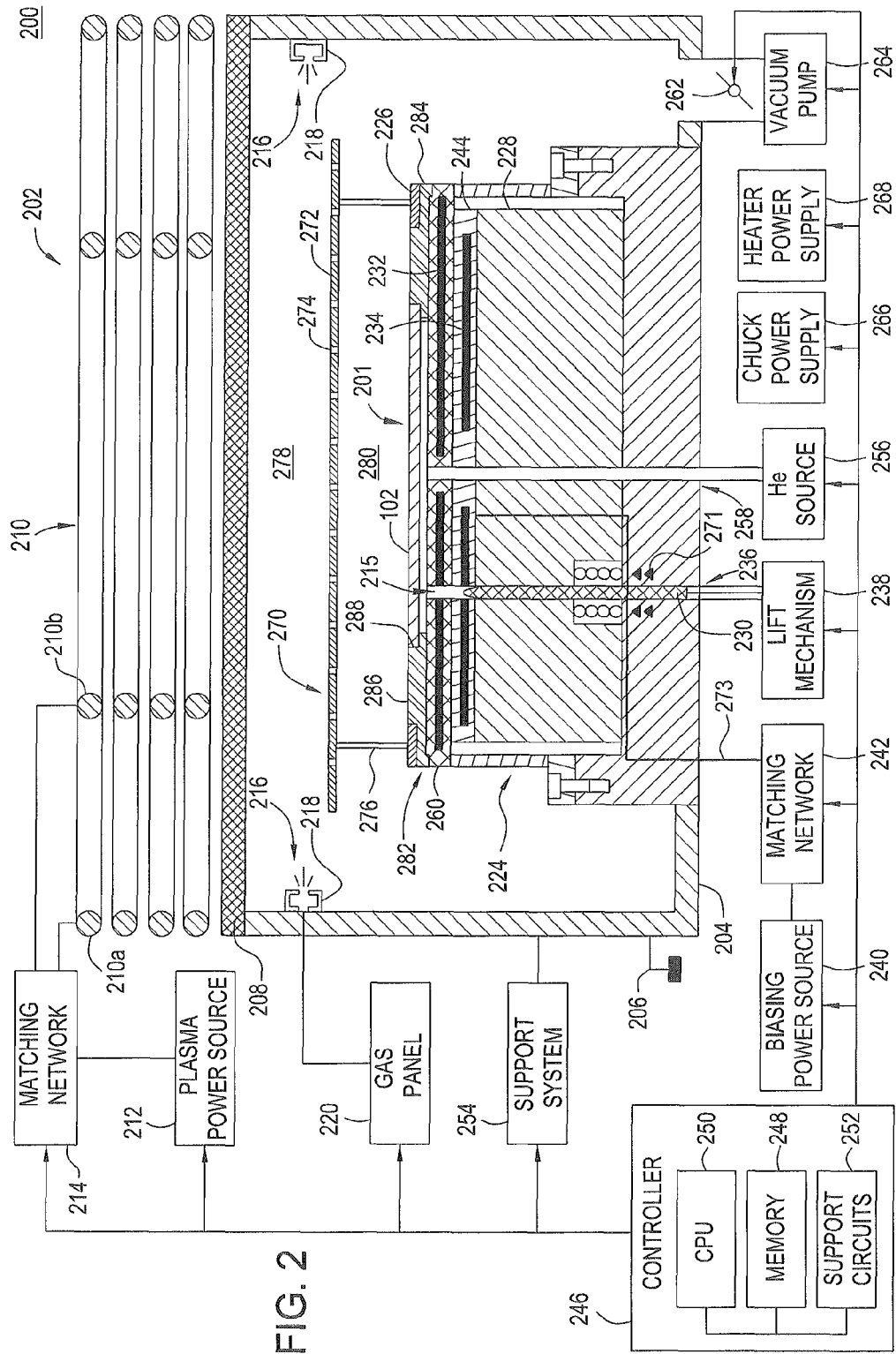
FIG. 2 depicts a schematic cross-sectional view of a processing chamber that may be utilized to fabricate a photomask in accordance with one embodiment of the present invention.

FIG. 2 depicts a schematic diagram of an etch reactor 200 suitable for processing a photomask substrate. Suitable reactors that may be adapted for use with the teachings disclosed herein include, for example, the Decoupled Plasma Source (DPS®) II reactor, or the Tetra I, Tetra II, Tetra X Photomask etch systems, all of which are available from Applied Materials, Inc. of Santa Clara, Calif. The particular embodiment of the reactor 200 shown herein is provided for illustrative purposes and should not be used to limit the scope of the invention. It is contemplated that the invention may be utilized in other plasma processing chambers, including those from other manufacturers.

The reactor 200 generally comprises a processing chamber 202 having a substrate pedestal 224 within a conductive body (wall) 204, and a controller 246. The chamber 202 has a substantially flat dielectric lid or ceiling 208. Other modifications of the chamber 202 may have other types of ceilings, e.g., a dome-shaped ceiling. An antenna 210 is disposed above the ceiling 208 and comprises one or more inductive coil elements that may be selectively controlled (two co-axial elements 210a and 210b are shown in FIG. 2). The antenna 210 is coupled through a first matching network 214 to a plasma power source 212, which is typically capable of producing up to about 3000 W at a tunable frequency in a range from about 50 kHz to about 13.56 MHz.

The substrate pedestal (cathode) 224 has a conductive path 273 coupled to a biasing power source 240. The biasing power source 240 generally is a source of up to about 500 W at a frequency of approximately 13.56 MHz that is capable of producing either continuous or pulsed power. The conductive path 273 provides a path to electrically connect the biasing power source 240 to the photomask substrate 102 positioned on the substrate pedestal (cathode) 224. Alternatively, the biasing power source 240 may be a DC or pulsed DC source.

In one embodiment, the substrate support pedestal 224 comprises an supporting plate 260, which optionally has at least one clamping electrode 232 and is controlled by a chuck power supply 266. In alternative embodiments, the substrate pedestal 224 may comprise substrate retention mechanisms such as a susceptor clamp ring, a mechanical chuck, or chuck free.

In one embodiment, the a supporting plate 260 configured to be in contact with the photomask substrate 102 is configured to at least have an area 201 fabricated from a conductive material located on the surface of the supporting plate 260 that supports the photomask substrate 102 during processing. The conductive material formed in the area 201 of supporting plate 260 may provide a conductive contact between the photomask 190 and the supporting plate 260. As discussed above, since the photomask substrate 102 is configured as a conductive photomask substrate, the conductive area 201 of the substrate support pedestal 224 electrically connects the photomask 190 and is also configured to be conductive so as to electrically connect to the biasing power source 240 through the conductive path 273 to the photomask 190 during processing. By doing so, a DC power may be utilized to provide a good and stable electrical bias to the photomask substrate 102 during processing so as to provide stable bias power during etching and resulting in uniform ion bombardment across the photomask surface. An AC power may also be applied on the photomask substrate 102 as needed. Details regarding how this conductive area 201 may be formed on the supporting plate 260 will be further discussed below with reference to FIGS. 3 and 4A-4B.

A reticle adapter 282 is used to secure the substrate (e.g., photomask or reticle), such as the substrate 102 depicted in FIGS. 1A-1B, on the substrate support pedestal 224. The reticle adapter 282 generally includes a lower portion 284 that covers an upper surface of the pedestal 224 (for example, the supporting plate 260) and a top portion 286 having an opening 288 that is sized and shaped to hold the substrate 102. The opening 288 is generally substantially centered with respect to the pedestal 224. The adapter 282 is generally formed from a single piece of etch resistant, high temperature resistant material such as polyimide ceramic or quartz. An edge ring 226 may cover and/or secure the adapter 282 to the pedestal 224.

A lift mechanism 238 is used to lower or raise the adapter 282 and the substrate 102 onto or off of the substrate support pedestal 224. The lift mechanism 238 comprises a plurality of lift pins 230 (one lift pin is shown) that travel through respective guide holes 295.

A gas panel 220 is coupled to the processing chamber 202 to provide process and/or other gases to the interior of the processing chamber 202. In the embodiment depicted in FIG. 2, the gas panel 220 is coupled to one or more inlets 216 formed in a channel 218 in the sidewall 204 of the chamber 202. It is contemplated that the one or more inlets 216 may be provided in other locations, for example, in the ceiling 208 of the processing chamber 202.

In one embodiment, the gas panel 220 is adapted to provide fluorinated process gas through the inlets 216 and into the interior of the body of the processing chamber 202. During processing, a plasma is formed from the process gas and maintained through inductive coupling of power from the plasma power source 212. The plasma may alternatively be formed remotely or ignited by other methods. In one embodiment, the process gas provided from the gas panel 220 includes at least a fluorinated gas and a carbon containing gas, an oxygen gas, and an chlorine containing gas. Examples of fluorinated and carbon containing gases include $CHF_3$ and $CF_4$. Other fluorinated gases may include one or more of $C_2F$, $C_4F_6$, $C_3F_8$ and $C_5F_8$. Examples of the oxygen containing gas include $O_2$, $CO_2$, $CO$, $N_2O$, $NO_2$, $O_3$, $H_2O$, and the like. Examples of the chlorine containing gas include $Cl_2$, $CCl_4$, $CHCl_3$, $CH_2Cl_2$, $CH_3Cl$, and the like.

The pressure in the processing chamber 202 is controlled using a throttle valve 262 and a vacuum pump 264. The vacuum pump 264 and throttle valve 262 are capable of maintaining chamber pressures in the range of about 1 to about 20 mTorr.

In operation, the temperature of the photomask 190 is controlled by stabilizing the temperature of the substrate pedestal 224. In one embodiment, the substrate support pedestal 224 comprises a resistive heater 244 and a heat sink 228. The resistive heater 244 generally comprises at least one heating element 234 and is regulated by a heater power supply 268.

An optional ion-radical shield 270 is disposed in the chamber 202 above the pedestal 224. The ion-radical shield 270 may electrically isolated from the chamber sidewalls 204 and the pedestal 224 such that no ground path from the shield 270 to ground is provided. One embodiment of the ion-radical shield 270 comprises a substantially flat plate 272 and a plurality of legs 276 supporting the plate 272. The plate 272, which may be made of a variety of materials compatible with process needs, comprises one or more openings (apertures) 274 that define a desired open area in the plate 272. This open area controls the amount of ions that pass from a plasma formed in an upper process volume 278 of the processing chamber 202 to a lower process volume 280 located between the ion-radical shield 270 and the substrate 102. The greater the open area, the more ions can pass through the ion-radical shield 270. As such, the size of the apertures 274 controls the ion density in volume 280, and the shield 270 serves as an ion filter. The plate 272 may also comprise a screen or a mesh wherein the open area of the screen or mesh corresponds to the desired open area provided by apertures 274. Alternatively, a combination of a plate and screen or mesh may also be used.

During processing, a potential develops on the surface of the plate 272 as a result of electron bombardment from the plasma. The potential attracts ions from the plasma, effectively filtering them from the plasma, while allowing neutral species, e.g., radicals, to pass through the apertures 274 of the plate 272. Thus, by reducing the amount of ions through the ion-radical shield 270, etching of the mask by neutral species or radicals can proceed in a more controlled manner. This reduces erosion of the resist as well as sputtering of the resist onto the sidewalls of the patterned material layer, thus resulting in improved etch bias and critical dimension uniformity.

Figure 3:
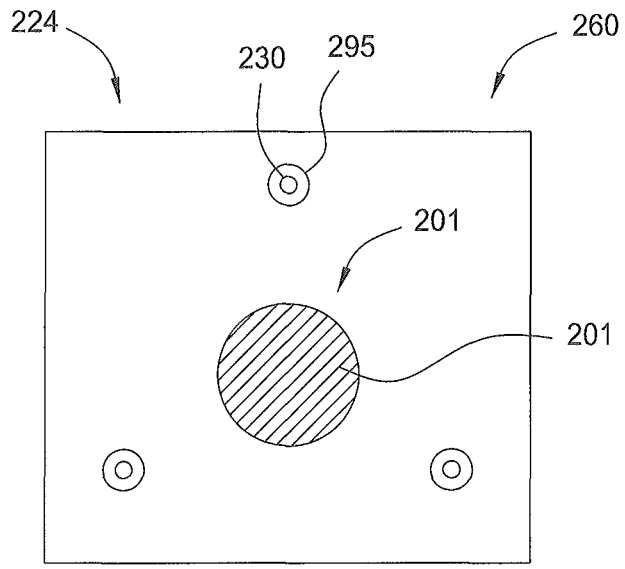
FIG. 3 depicts a top view of a substrate support pedestal disposed in the processing chamber of FIG. 2 in accordance with one embodiment of the present invention.

FIG. 3 depicts a top view of the substrate support pedestal 224 disposed in the processing chamber of FIG. 2 in accordance with one embodiment of the present invention. As discussed above, the supporting plate 260 is disposed on the substrate support pedestal 224. The lift pins 230 are disposed in the guide holes 295 formed through the substrate support pedestal 224. The area 201 of the supporting plate 260 may be formed from a conductive material so that when the conductive photomask 190 is positioned thereon, the direct current (DC) power supplied from the biasing power source 240 may be directly delivered through the conductive area 201 of the supporting plate 260 through the conductive path 273 to the photomask 190 in direct electrical contact with the area 201. Suitable materials that may be utilized to form the area 201 may include stainless steel, aluminum, copper, chromium, alloys thereof, and or other suitable conductive materials. It is noted that the area 201 formed in the supporting plate 260 may have various configurations, sizes, shapes, or dimensions as long as the direct current (DC) power can pass therethrough through the conductive path 273 to the conductive photomask 190 positioned thereon. In the example illustrated in FIG. 3, the conductive area 201 may have a ring shape having a diameter between about 20 mm and about 150 mm.

Alternatively, upper surface of the supporting plate 260 may, as a whole, be manufactured from a conductive material, so as to facilitate delivering direct current (DC) power through the supporting plate 260 to the conductive photomask 190 through the conductive path 273. It is noted that the area 201 of the substrate support pedestal 224 where the photomask 190 is in contact is always conductive so that direct current (DC) power supplied therethrough would not be blocked by insulated materials, which may adversely prevent the current from passing to the conductive photomask 190 during processing. In one embodiment, the supporting plate 260 may have a conductive body manufactured from conductive material, such as aluminum, stainless steel and the like. In another embodiment, the supporting plate 260 may have a thin conductive coating disposed on the surface of the supporting plate 260 where the photomask 190 is in contact with when positioned thereon during processing. The thin conductive coating may have a thickness between about 10 nm and about 2000 nm. Suitable examples of the conductive coating may include stainless steel, aluminum, copper, chromium, alloys thereof, and or other suitable conductive materials.

Figures 4A, 4B:
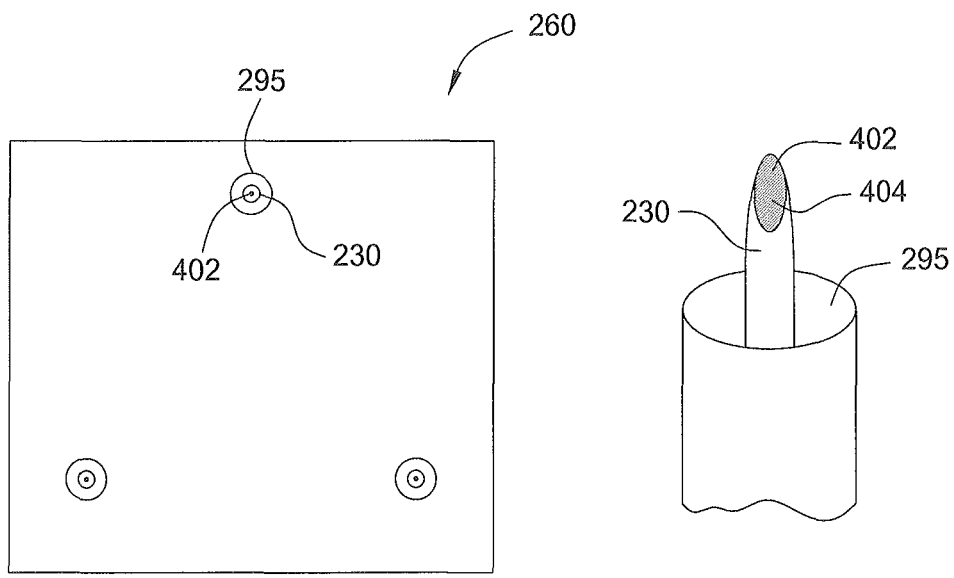
FIG. 4A depicts a top view of lift pins disposed in a substrate support pedestal disposed in the processing chamber of FIG. 2 in accordance with one embodiment of the present invention.
FIG. 4B depicts a cross sectional view of a lift pin extending outward from a lift pin hole disposed in the processing chamber of FIG. 2 in accordance with one embodiment of the present invention.

FIG. 4A depicts a top view of lift pins 230 disposed in the substrate support pedestal 224 in accordance with one embodiment of the present invention, wherein the lift pins 230 function as the conductive area 201 so as to allow DC power from the biasing power source 240 to pass therethrough to the photomask 190 during processing. Some conductive springs 271 may be optionally disposed around the lift pins 230 in the substrate pedestal (cathode) 224 to assist conductive coupling of the conductive path 273 to the lift pins 230.

During processing, the lift pin 230 embedded in the substrate support pedestal 224 may have a tip 402 of the lift pin 230 in contact with the backside conductive layer 194 of the photomask 190. Accordingly, by selecting a conductive material to fabricate at least the tip 402 of the lift pin 230, the DC power may be connected to the photomask substrate 102 rest thereon during processing, creating a conductive path from the biasing power source 240 to the photomask 190 through the lift pins 230. In one embodiment, the lift pin 230 may have a conductive body to form a conductive path. Suitable materials that may be utilized to manufacture the lift pin 230 include stainless steel, copper and chromium nitride.

In another embodiment, the lift pin 230 is conductive and placed in contact with the photomask 190 during processing. In the cross sectional view of the lift pins 230 depicted in FIG. 4B, the tip 402 of the lift pin 230 may be manufactured from a conductive material to facilitate delivery DC power therethrough to the photomask substrate 102 during processing. Alternatively, instead of manufacturing the body of the tip 402 from a conductive material, a conductive coating 404 may be coated onto the tip 402 of the lift pin 230 to allow the DC power passing therethrough to the photomask substrate 102 during processing. In one embodiment, the conductive coating 404 may have a thickness between about 100 um and about 500 um. Suitable materials of the conductive materials or conductive coatings 404 that may be utilized to manufacture or coat the tip 402 of the lift pin 230 may includes stainless steel, copper or chromium nitride.

Thus, an apparatus and methods utilized a DC power to supply through a conductive substrate support pedestal to a conductive photomask substrate during a photomask substrate manufacturing process for EUV applications are provided. The apparatus and methods provide a conductive photomask along with an at least partially conductive substrate support pedestal in contact with the conductive photomask during a photomask substrate manufacture process for EUV applications. The conductive photomask along with the at least partially conductive substrate support pedestal advantageously facilitates a DC power to be supplied therethrough to the conductive photomask substrate in a relatively more stable manner, as compared to conventional AC power utilized in non-conductive photomask substrate applications. By doing so, a more controllable and steady RF power control may be obtained during a photomask substrate etching process, thereby improving fabrication precision for patterning features having small critical dimensions in EUV technologies.

While the foregoing is directed to embodiments of the present invention, other and further embodiments of the invention may be devised without departing from the basic scope thereof, and the scope thereof is determined by the claims that follow.

The invention claimed is:

1. A method for etching a photomask for lithographic applications, comprising:
   providing a conductive photomask on a substrate support pedestal disposed in a plasma processing chamber, wherein the conductive photomask is fabricated from a dielectric material substrate with a conductive coating;

supplying a gas mixture into the processing chamber; and applying a DC or AC power through a conductive path formed in the substrate support pedestal to the conductive photomask during etching, wherein the substrate conductive path in the substrate support pedestal allows DC or AC power to pass therethrough to the conductive photomask.

2. The method of claim 1, wherein the conductive path is connected to a conductive area formed around a center of the substrate support pedestal.

3. The method of claim 1, wherein the conductive path is connected to a conductive layer coated on a surface of the substrate support pedestal where the photomask is rest on during processing.

4. The method of claim 1, wherein the conductive path is connected to a tip of a lift pin disposed in the substrate support pedestal.

5. The method of claim 1, wherein the conductive path is a conductive body formed for the substrate support pedestal.

6. The method of claim 1, wherein the photomask includes a film stack having a conductive absorber layer disposed on an upper surface of the dielectric material substrate.

7. The method of claim 6, wherein the photomask includes a backside conductive layer disposed on a back surface of the dielectric material substrate.

8. The method of claim 7, wherein the photomask comprises a side conductive element disposed on a side of the photomask connecting between the conductive absorber layer and the backside conductive layer.

9. The method of claim 7, wherein the conductive element is a conductive layer, a conductive wire, a conductive bar or a conductive ribbon.

10. A method for etching a photomask for lithographic applications, comprising:

applying a DC or AC power through a conductive path formed in a substrate support pedestal to a conductive photomask disposed on the substrate support pedestal in an etching chamber during etching, wherein the substrate conductive path in the substrate support pedestal allows DC or AC power to pass therethrough to the conductive photomask, wherein the conductive photomask is fabricated from a dielectric material substrate with a conductive coating.

11. The method of claim 10, wherein the conductive path is connected to a conductive area formed around a center of the substrate support pedestal.

12. The method of claim 10, wherein the conductive path is connected to a conductive layer coated on a surface of the substrate support pedestal where the photomask is rest on during processing.

13. The method of claim 10, wherein the conductive path is connected to a tip of a lift pin disposed in the substrate support pedestal.

14. The method of claim 10, wherein the conductive path is a conductive body formed for the substrate support pedestal.

15. The method of claim 10, wherein the photomask includes a film stack having a conductive absorber layer disposed on an upper surface of the dielectric material substrate.

16. The method of claim 15, wherein the photomask includes a backside conductive layer disposed on a back surface of the dielectric material substrate.

17. The method of claim 16, wherein the photomask comprises a side conductive element disposed on a side of the photomask connecting between the conductive absorber layer and the backside conductive layer.

18. The method of claim 17, wherein the conductive element is a conductive layer, a conductive wire, a conductive bar or a conductive ribbon.

19. The method of claim 16, wherein the conductive absorber layer is a tantalum containing layer and the backside conductive layer is a chromium containing layer.

20. The method of claim 16, wherein the photomask further includes a multi-material layer and a capping layer disposed on the upper surface of the dielectric material substrate below the conductive absorber layer, wherein the multi-material layer includes repeating pairs of molybdenum layers and silicon layers.

* * * * *